United States Patent [19]

Doehler

[11] Patent Number: 5,223,308
[45] Date of Patent: Jun. 29, 1993

[54] LOW TEMPERATURE PLASMA ENHANCED CVD PROCESS WITHIN TUBULAR MEMBERS

[75] Inventor: Joachim Doehler, Union Lake, Mich.

[73] Assignee: Energy Conversion Devices, Inc., Troy, Mich.

[21] Appl. No.: 780,658

[22] Filed: Oct. 18, 1991

[51] Int. Cl.⁵ .......................... B05D 3/06; B05D 7/22
[52] U.S. Cl. ..................................... 427/575; 427/573; 427/570; 427/569; 427/237; 427/238; 427/105; 118/723; 118/729
[58] Field of Search .............. 427/45.1, 38, 39, 237, 427/238, 255.5, 105, 398.1, 575, 573, 570, 569; 118/723, 729, 718

[56] References Cited

U.S. PATENT DOCUMENTS

| | | | |
|---|---|---|---|
| 4,349,582 | 9/1982 | Beerwald et al. | 427/38 |
| 4,417,911 | 11/1983 | Cundy et al. | 65/3.12 |
| 4,692,347 | 9/1987 | Yasuda | 427/40 |
| 4,897,284 | 1/1990 | Arai et al. | 427/39 |
| 4,897,285 | 1/1990 | Wilhelm | 427/39 |
| 4,965,090 | 10/1990 | Gärtner et al. | 427/39 |

*Primary Examiner*—Michael Lusigan
*Assistant Examiner*—Roy V. King
*Attorney, Agent, or Firm*—Marvin Siskind; Marc Luddy; David Schumaker

[57] ABSTRACT

A method for the low temperature, microwave enhanced, chemical vacuum deposition of thin film material onto a surface of a hollow member by creating a sub-atmospheric pressure condition adjacent the surface to be coated while maintaining the applicator through which microwave energy is introduced at substantially atmospheric pressure.

20 Claims, 2 Drawing Sheets

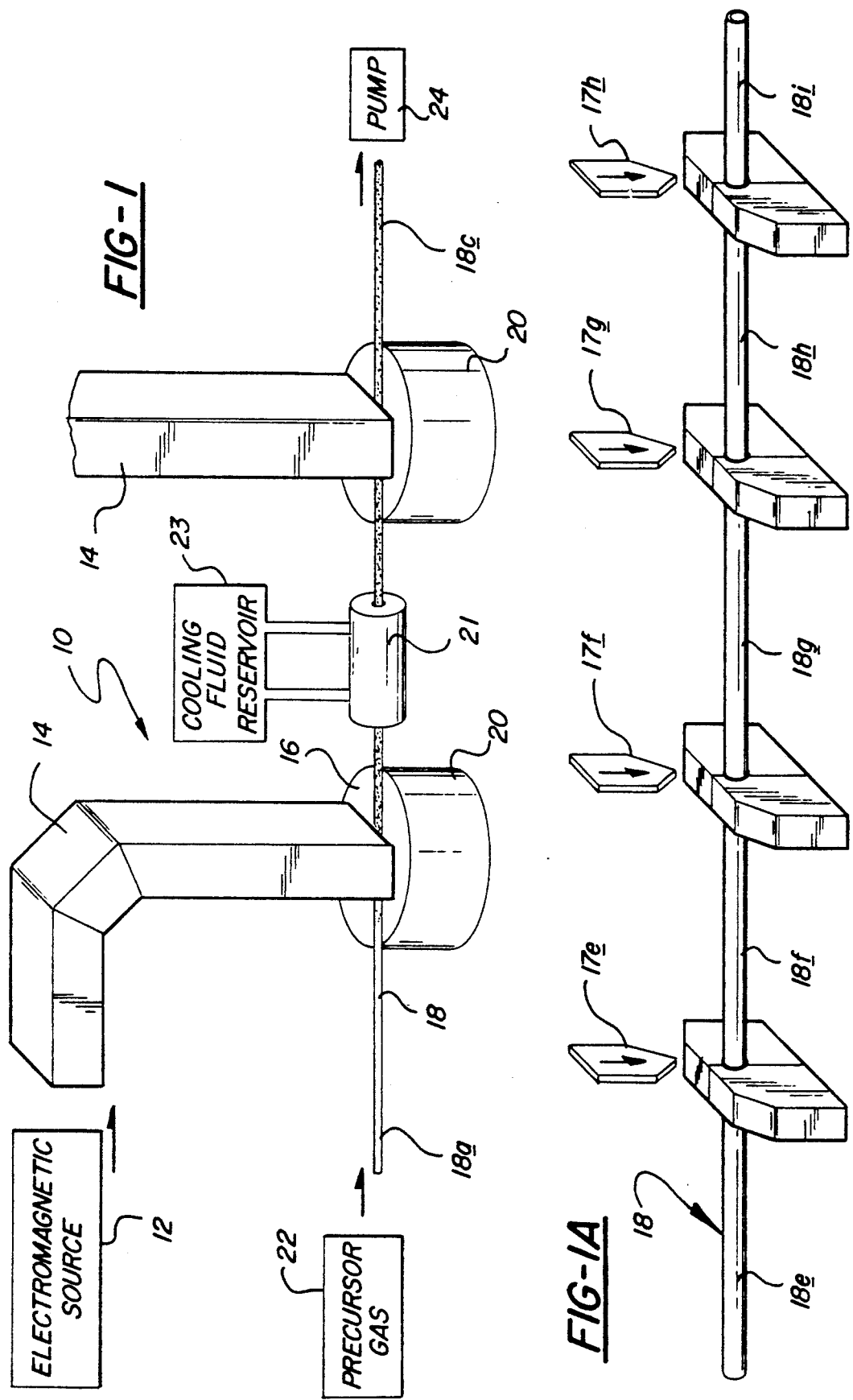

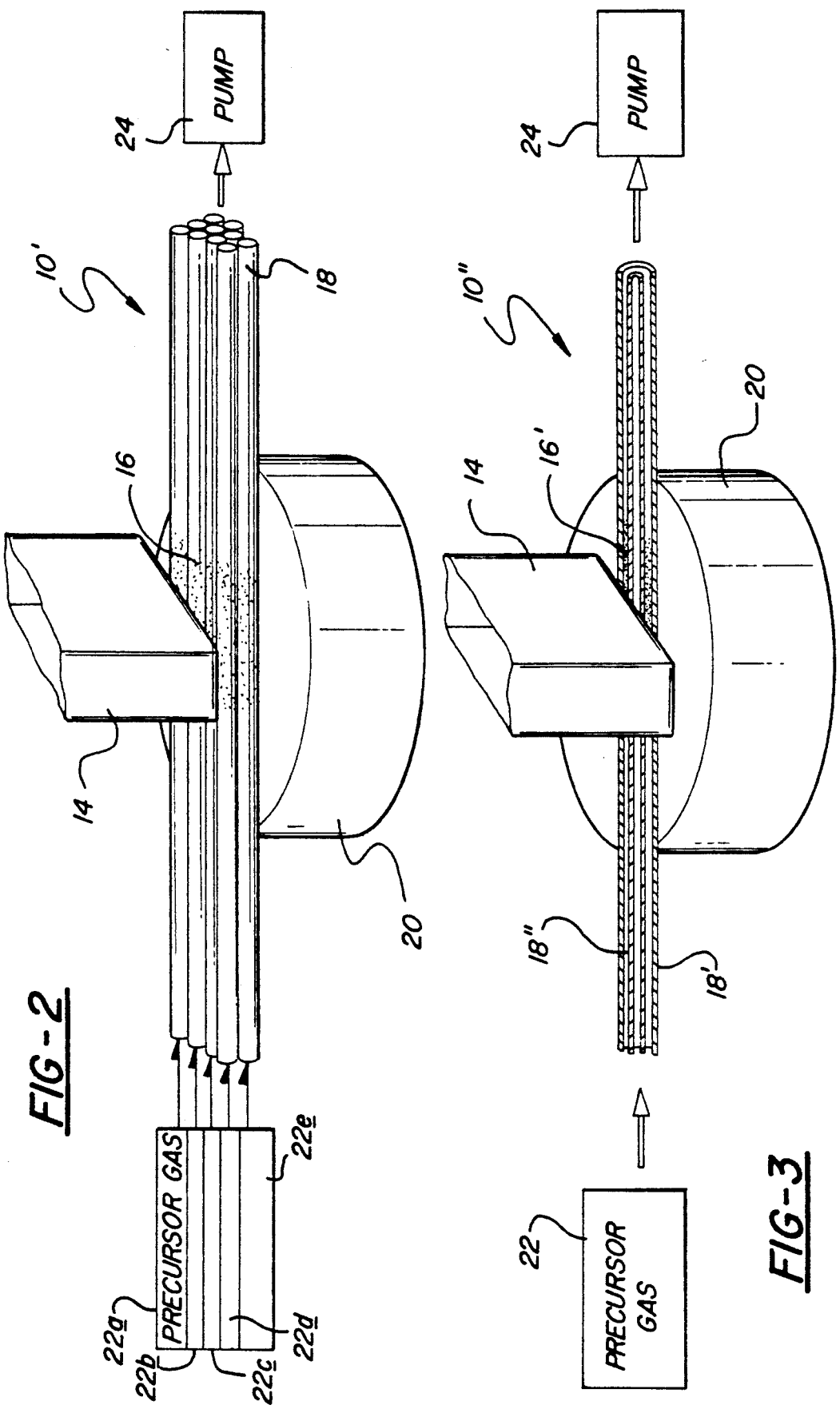

LOW TEMPERATURE PLASMA ENHANCED CVD PROCESS WITHIN TUBULAR MEMBERS

FIELD OF THE INVENTION

This invention relates generally to plasma enhanced chemical vapor deposition and more particularly to a method and apparatus for the low temperature, microwave assisted, chemical vapor deposition of thin film material onto the interior surface of a hollow, generally tubular member by creating a sub-atmospheric pressure condition adjacent the surface to be coated while maintaining the applicator, through which the microwave energy is introduced, at substantially atmospheric pressure.

BACKGROUND OF THE INVENTION

Many techniques for the generation of glow discharge plasmas for the purpose of depositing thin film materials have been investigated. These techniques have included methods of plasma generation through the use of direct current and alternating current at sub-atmospheric pressure conditions. Various AC frequencies have been utilized, such audio, radio frequency (R.F.) and a microwave frequency of about 2.56 GHz. The assignee of the instant invention, has disclosed, in U.S. Pat. No. 4,504,518, entitled METHOD OF MAKING AMORPHOUS SEMICONDUCTOR ALLOYS AND DEVICES USING MICROWAVE ENERGY, the disclosure of which is incorporated herein by reference, that the optimum combination of power and pressure at which to deposit thin film material by plasma enhanced chemical vapor deposition processes is defined by the substantial minimum of the modified Paschen curve for the particular precursor gaseous mixture being used. The modified Paschen curve defines the voltage needed to sustain the glow discharge plasma at each pressure in a range of pressures.

In a typically sized, conventional R.F. glow discharge system, the minimum of the modified Paschen curve was found to occur at a few hundred millitorr. By increasing the applied R.F. power, the gaseous utilization efficiency and the deposition rate also increased. However, simply increasing the R.F. power to increase deposition rates, also leads to the production of films of decreasing quality and can additionally result in the (1) generation of powder and (2) deposition of films which include polymeric material. While the increased deposition rate with increased R.F. power is a result of an increase in the concentration of excited species resulting principally from collisions between electrons and feedstock molecules; the collision rate between excited species (and more importantly between excited species and feedstock molecules) is also increased. This results in the formation of polymeric chains. In order to reduce the number of undesirable collisions, it is possible to reduce the operating pressure, but such a reduction in pressure moves the deposition process up from the minimum of the modified Paschen curve; the result being that substantially greater R.F. power is required in order to achieve the same degree of plasma excitation. This is because, as the operating pressure is reduced, many electrons that would have collided with and excited feedstock molecules at higher operating pressures, now impinge on either the substrate or system walls without suffering any inter-molecular collisions.

In the aforementioned +518 patent, the assignee of the instant invention discloses that for a given deposition system, the minimum in the modified Paschen curve shifts to lower pressure values with increasing frequency, such as microwave frequencies, vis-a-vis, R.F. frequencies. Therefore, the use of high frequency microwave energy in a glow discharge deposition system was found to provide for operation of that system at greatly reduced pressure. The result was the ability to generate a higher concentration of excited species, and thus to provide higher rates of deposition and gas utilization efficiencies without the production of powder or the inclusion of polymeric species in the depositing film. The shift in the minimum of the modified Paschen curve to lower pressures as the frequencies increase is believed to occur because, for a given gas pressure at the higher excitation frequencies, the rapid reversals of the applied electric field allows electrons to collide with more feedstock molecules in the plasma excitation region before encountering the walls of the system.

While the assignee of the instant invention has previously discovered the improved efficiency in manufacturing economy as well as the improved material quality capabilities which can be provided by (1) operating at the substantial minimum of the modified Paschen curve and (2) utilizing microwave enhanced chemical vapor deposition, the aforementioned '518 patent had a significant drawback. Said patent required that the microwave energy be introduced into the interior of a vacuumized deposition chamber from a source maintained at atmospheric pressure. This meant that (1) complex vacuum sealing of the microwave waveguide (or other microwave transmitting apparatus) to the vacuum chamber had to be effected and (2) the coupling of that microwave energy into the interior of the vacuum chamber had to be effected. Further, all such prior art microwave enhanced, chemical vapor deposition processes of which the instant inventors are aware employ a relatively large vacuum chamber. The utilization of large vacuum chambers has the inherent disadvantage of requiring correspondingly large gas throughput and vacuum pumping capabilities regardless of the size of the substrate. It is, therefore, one major objective of the instant invention to substantially eliminate all of the hereinabove enumerated deficiencies of prior art systems.

BRIEF SUMMARY OF THE INVENTION

The inventor has developed a process whereby the microwave energy transmitting apparatus, such as the microwave waveguide (which is adapted to transmit microwave energy from a source to the plasma region), may be maintained at substantially atmospheric pressure while the surface area of the substrate to be coated is maintained at sub-atmospheric pressure. The specific application of this type of process is one in which the deposition occurs interiorly of a hollow tubular member through which a flow of precursor deposition gas is initiated. The deposition pressure is dependent upon the ability of the tubular or other hollow member to maintain its mechanical integrity under vacuum conditions. By creating a desired flow of the precursor deposition gas into the interior of that hollow member, sub-atmospheric pressures can be attained. When that gas is exposed to the electromagnetic field generated by the transmission of microwaves from the waveguide, a glow discharge plasma is developed and a thin film of material is deposited about the interior surface of the hollow member.

As to prior art, the attention of the reader is directed to conventional methods of fabricating low loss, single mode optical fibers consisting of a $P_2O_5$—$SIO_2$ cladding and a $GeO_2$—$P_2O_5$—$SiO_2$ core. These optical fibers are commonly drawn from preforms by a modified chemical vapor deposition technique. In this "MCVD" process, deposition gases are introduced so as to flow down the center of a silica tube, which tube is heated by an externally disposed oxyhydrogen torch. The torch travels in the same direction as the interior flow of the deposition gases. As the deposition gases approach the hot zone, a reaction occurs resulting in a formation of submicron particles. The reaction may be intensified by simultaneously subjecting the deposition gases to the effects of electromagnetic energy, such as an R.F. or microwave field. A portion of these particles are thus deposited on the walls of the tube downstream of the torch. Subsequently, the deposited particles are consolidated into a vitreous, pore-free layer by viscous sintering. In contrast to the process employed by the instant inventors and as should be apparent to one of ordinary skill in the art, the deposition temperatures utilized in such MCVD processes are extremely high, on the order of 1600 to 2000 degrees C. The instant inventors know of no processes in which the a source of energy, such as microwave energy, applied externally to the deposition region, is maintained at sub-atmospheric pressure and used to excite a precursor deposition gas interiorly of a vacuumized hollow member so as to deposit a thin film coating on the internal surface thereof, especially at temperatures no warmer than 1,000° C. and preferably less than 300° C.

There is disclosed herein a method for the low temperature, chemical vacuum deposition of thin film material onto the interior surface of at least one hollow member. The method includes the non-sequential steps of: providing a source of electromagnetic energy, said source including means for generating an electromagnetic field over a given volume of parameter space; providing at least one hollow member having an internal surface to be coated; positioning at least a portion of said surface of said member within said electromagnetic field; evacuating the area about the portion of said surface over which the electromagnetic field is generated to sub-atmospheric pressure while maintaining said introducing means at substantially atmospheric pressure; flowing a precursor deposition gas about at least the portion of said surface exposed to said electromagnetic field; maintaining the temperature of said hollow member at substantially less than 1000° C.; and activating said source of electromagnetic energy. In this manner, the precursor gas is decomposed and thin film material is deposited onto at least a portion of the interior surface of said member exposed to said electromagnetic field.

In a preferred embodiment, the source of electromagnetic energy is microwave energy and the at least one hollow member is formed of a microwave transmissive material, such as nylon or other synthetic plastic resin. The precursor deposition gas is introduced to flow through the interior of said hollow member for generating a plasma therewithin. In such an instance, the hollow member is an elongated tube, the interior of which is evacuated to sub-atmospheric pressure. The precursor deposition gas introduced into the interior of the elongated tube will preferably comprise elements selected from the group consisting essentially of one or more of silicon, oxygen, nitrogen, and carbon; and, in one embodiment is adapted to deposit a hermetic coating onto the internal surface of said tube. In order to coat the entire internal surface of said elongated tube, the electromagnetic field and the elongated tube may be moved relative to one another.

In a second preferred embodiment, the at least one hollow member is a first elongated tube having a given external diameter and a second elongated tube is provided, said second tube having an internal diameter greater than the external diameter of the first tube. In this embodiment, the first elongated tube is concentrically disposed internally of said second elongated tube and the precursor deposition gas is directed to flow through the annular space formed between the first and second concentrically disposed elongated tubes so as to generate a plasma in the area defined therebetween.

In this second embodiment of concentrically disposed tubular members, it is necessary that the second elongated tube also be formed of microwave transmissive material, whereby the precursor gas flowing between the first and the second elongated tubes is decomposed by the electromagnetic field and deposited onto at least a portion of the external surface of said first elongated tube. Again, the precursor deposition gas preferably includes one or more elements selected from the group consisting essentially of silicon, oxygen, nitrogen, and carbon; and is selected to deposit, for instance, a hermetic coating onto the external surface of said first elongated tube. The first elongated tubes may be moved through said electromagnetic field while the second elongated tube is held stationary; although, in still another preferred embodiment, the second elongated tube may move through the electromagnetic field along with the first elongated tube. In a still further preferred embodiment, the first and the second tube may move through the electromagnetic field at different rates of speed. As an additional step which can be implemented in either of the preferred embodiments, for the purposes of automation, the hollow member may be cut into smaller members of a preselected size after the thin film material has been deposited thereupon.

There is also disclosed herein apparatus for the low temperature, chemical vacuum deposition of thin film material onto the internal surface of at least one hollow member. The apparatus comprises: a source of electromagnetic energy, said source including means for generating an electromagnetic field over a given volume of parameter space; a hollow member having an interior surface to be coated; means for positioning at least a portion of said surface to be coated within said electromagnetic field; means connected to said hollow member for evacuating the interior thereof to sub-atmospheric pressure while said introducing means is maintained at substantially atmospheric pressure; means for maintaining the temperature of said hollow member at substantially less than 1000° C.; and means for flowing a precursor deposition gas through the interior of said hollow member. In this manner, a plasma of said precursor deposition gas is generated about, and thin film material is deposited upon, at least that portion of the interior of said hollow member over which said electromagnetic field acts.

The source of electromagnetic energy may be a microwave generator, the introducing means may be a radiative microwave applicator and the hollow member is preferably formed of microwave transmissive material such as nylon or other synthetic plastic resin. In a preferred embodiment, the hollow member is formed as an elongated tube and a precursor gas is introduced into the interior of the elongated tube, said gas selected from the group consisting essentially of silicon, oxygen, nitrogen and carbon. In this manner, a hermetic, a hard or a transparent coating can be formed onto the internal surface of the elongated tube. Means are also provided for moving the electromagnetic field and the elongated tube relative to one another so as to provide for the entire interior surface of the elongated tube to be coated with said thin film material.

These and other objects and advantages of the instant invention will become apparent from a careful perusal of the drawings, the Detailed Description Of The Invention and the Claims which follow hereinafter.

BRIEF DESCRIPTION OF THE DRAWINGS

FIG. 1 is a schematic, stylized and partially perspective view of the low temperature, plasma enhanced, chemical vapor deposition apparatus of the instant invention, which apparatus is adapted to deposit thin film material onto the internal surface of an elongated tubular member moving through one or more discrete, spacedly disposed electromagnetic fields;

FIG. 1A is a perspective, stylistic view of a portion of the coated tubular member moving through a severing station operatively located downstream of the deposition station(s) of FIG. 1, said severing station adapted to cut said elongated tubular member into a plurality of members of smaller lengths;

FIG. 2 is an enlarged, schematic, perspective view of the area over which the electromagnetic field generated by one of the microwave applicators illustrated in FIG. 1 acts, said applicator adapted to generate a plasma and deposit thin film material onto the internal surface of a plurality of elongated, hollow tubular members; and FIG. 3 is an enlarged, schematic, perspective view, partially in cross-section, of the microwave apparatus illustrated in FIGS. 1 and 2, said view depicting an alternate embodiment of the instant invention wherein the interior one of a pair of concentrically arranged, elongated tubular members has thin film material deposited upon the external surface thereof, as that interior tubular member is moved through the electromagnetic field.

DETAILED DESCRIPTION OF THE INVENTION

Referring now to the drawings and specifically to FIG. 1, it is to be noted that the reference numeral 10 will hereinafter refer generally to the low temperature, plasma enhanced, chemical vapor deposition apparatus of the instant invention. The deposition apparatus 10 is of the type which includes a source of electromagnetic energy 12 such as, for instance, a microwave generator. As is well known to those of ordinary skill in the art of transmitting microwave energy from a magnetron (or other like source) to a remote deposition region, a generally rectangular (in cross-sectional configuration) radiative microwave waveguide 14 can be employed to transmit microwaves from the source 12 into a given volume of parameter space defined, for purposes of the instant invention, as that space in which an electromagnetic field is generated. It is through this electromagnetic field of intense microwave energy that an elongated, hollow, generally tubular member, such as an elongated tube 18, is continuously moved. While the hollow tubular member 18 is illustrated as having a generally circular cross-sectional configuration; it should be apparent to those of ordinary skill in the art that a hollow, elongated microwave transmissive member of any desired cross-sectional configuration may be used without departing from the spirit or scope of the instant invention. It is also to be noted that the length of the "elongated" hollow member is relative and any length, ranging from millimeters to kilometers, can be utilized in keeping with the true inventive nature of this invention.

At the side of the hollow member 18 opposite the microwave applicator 14 there is disposed a dummy load 20 depicted as an enclosure filled with a microwave absorbing material, such as water. The dummy load 20 is adapted to dissipate any microwave energy not utilized in the decomposition of the precursor deposition gas flowing through the interior of the elongated hollow member. Although not shown, it should also be apparent to those ordinarily skilled in the art of microwave deposition that the microwave absorbing material could be circulated through a heat exchanger to maintain the temperature of the water in the dummy load 20 at a low level. Further, and although also not shown, a wire mesh cage can be placed about the plasma region 16 so as to confine the electromagnetic field and prevent stray microwaves from injuring operators of the apparatus 10.

In one preferred embodiment, the elongated tubular member 18 may be formed of nylon or any other synthetic plastic resin which is substantially microwave transmissive. It should be readily appreciated that the microwave transmissivity of the tubular member 18 is essential so that a plasma of decomposed precursor gas may be formed by the electromagnetic field acting interiorly thereof for depositing thin film material upon the internal circumferential surface of that tubular member. To that end, a source of precursor deposition gas 22 is introduced at the pay-off end 18a of the tubular member 18. The distal end 18c of the tubular member 18 is connected to a vacuum pump 24 for creating a flow of the precursor deposition gas from the source 22 through the deposition region. The flow rate of the precursor deposition gas is then selected so as to maintain the pressure within the tubular member 18 below atmospheric pressure.

It is to be noted that the choice of power and pressure is selected so that the deposition of thin film material onto the internal wall of the tubular member 18 occurs at the substantial minimum of the Paschen curve for that particular gaseous deposition. Note, however, that the sub-atmospheric pressure utilized is limited by the material from which the tubular member is fabricated. As should be readily apparent, a tubular member formed of a 100 meter length of nylon cannot be pumped too far below atmospheric pressure before losing its structural integrity and collapsing.

Further note that the tubular member 18 can become very hot as it moves through the electromagnetic field developed by the microwaves transmitted by the waveguide 14. Also, as will be described in further detail hereinafter, it may be necessary to employ more than one waveguide in order to deposit the thin film material to a desired thickness. However, most of the synthetic plastic resins from which the tubular member may be fabricated are characterized by limited temperature tolerance and therefore cannot be subjected to such intense plasmas for prolonged periods of time without flowing or melting. Therefore, it may be necessary to operatively dispose a cooling station, such as, immediately following each of the microwave applicators 14 so as to reduce of the elevated temperature of the tubular member 18 prior to the entry thereof into a succeeding deposition station. The cooling station may simply comprise a water jacket 21 disposed about the member and adapted to circulate water, or other thermal transfer fluid, from a reservoir 23.

As referred to hereinabove, one particular application for the low temperature, plasma assisted, chemical vapor deposition apparatus 10 of the instant invention is in the deposition of a thin film coating onto the internal circumferential wall of the elongated tubular member 18 fabricated of a nylon material so as to hermetically seal same from gaseous permeation or other ambient conditions. Such nylon tubes, as hermetically sealed with a coating of silicon oxide, silicon nitride, or silicon oxycarbide, or similar sealing material, are commercially important in the automotive industry. Such hermetically sealed tubes form the hydraulic air conditioning hoses for automobiles. After being hermetically sealed, these hoses can have a liquid coolant material, such as freon, travel therethrough without the loss of that freon to atmosphere. However, it is to be specifically noted that the instant invention is not limited to hermetically sealed tubes; rather, this invention is generally applicable to the deposition of any type of coating onto the walls of a hollow member for accomplishing any given function. The only significant limitation is that the tubular member must be formed of a material transmissive to microwave energy transmitted by the waveguide 14 from the source of electromagnetic energy 12.

Turning now to FIG. 1A, the elongated tubular member 18 which has now passed through the plasma region 16 generated by the electromagnetic field illustrated in FIG. 1 so as to have the internal peripheral surface of the tubular member coated with thin film material, is moved to a cutting station which is located downstream thereof. At this cutting station, said elongated tubular member 18 may be simultaneously severed by one or a plurality of blades, such as 17e, 17f, 17g and 17h, into a plurality of smaller sections, such as 18e, 18f, 18g, 18h, and 18i, of any desired length. In this manner, the nylon tubing, as coated with a thin hermetic seal, is adapted to provide the proper structural and functional interconnection between the two hydraulic lines of an automotive vehicle which carry freon in a leak-proof fashion. A further advantageous feature of this embodiment of the instant invention is that, rather than having the thin film material coated about the external periphery of the tubular member 18, the thin film material is coated on the internal surface thereof; which internal coating provides the ability to clamp the end sections of the severed tubular member sections 18a–18i without deteriorating the quality of the coating at the distal ends of those sections.

Referring now to the embodiment of the instant invention illustrated in FIG. 2, like reference numerals will be used to refer to like elements described hereinabove with respect to FIG. 1. Accordingly, the low temperature, plasma enhanced, chemical vapor deposition apparatus depicted therein will be generally referred to by the reference numeral 10'. In this embodiment of the invention, a plurality of hollow, elongated, generally tubular members 18 are operatively positioned within the volume of parameter space over which the electromagnetic field operates in order to simultaneously generate a plasma region 16 internally of each of those members. Above the plurality of tubular members 18 is disposed at least one radiative microwave applicator 14. While this applicator has the upper portion thereof cut-away, it is to be understood, that the upper portion is connected to a source of electromagnetic radiation 12 similar to the source described hereinabove with respect to FIG. 1. Also, disposed below the tubular members 18 is the dummy load 20 which once again includes an enclosure filled with microwave absorbing material, such as water, for harmlessly disposing of any microwave energy not dissipated in generating the plasma of deposition species from the precursor deposition gas flowing through the tubular members. To the left hand side of the generally tubularly shaped members 18 there is disposed a precursor gaseous mixture, such as one or more of $SiH_4$, $H_2$, $SiF_4$, $CH_4$, $C_2H_6$ and the like, adapted to be introduced from discrete conduits such as 22a, 22b, 22c, 22d, and 22e into respective ones of the tubular members 18. As was also true in the description of FIG. 1, FIG. 2 depicts a mechanical or diffusion vacuum pump 24 disposed on the right hand side of, and operatively connected, to the tubular members 18 for evacuating the interior of those tubular members to a prescribed sub-atmospheric pressure regime which is selected so that the deposition of thin film material may occur at the substantial minimum of the modified Paschen curve, i.e., the minimum power-pressure regime at which the microwave transmissive tubular members can operate without collapsing.

The manner in which the embodiment illustrated in FIG. 2 differs from the embodiment illustrated and previously described with reference to FIG. 1 is in the simultaneous deposition of thin film material onto the internal surfaces of a plurality of elongated tubular members 18. By providing a flow of precursor deposition gas from the sources 22a–22e through respective ones of the plurality of tubular members, and by utilizing an appropriate amount of power for the transmission of microwave energy from the source (not shown) to the waveguide 14, it becomes possible to simultaneously generate a plasma of deposition species interiorly of each of the microwave transmissive tubular members.

Obviously, such an arrangement of tubular members provides for greatly increased throughput capabilities when it is necessary to deposit thin film material onto a surface of a large number of tubular members from a single set of microwave applicators. As alluded to hereinabove, the transit time which the tubular members 18 spend exposed to an electromagnetic field of a given strength generated by the microwave energy determines the thickness of thin film material deposited upon the internal surfaces thereof. Therefore, by selecting the rate of movement of the tubular members 18 through the electromagnetic field, the strength of that field and the flow rate of the precursor gas, any given thickness of material may be deposited. However, the rate of movement of the tubular members cannot be so slow that the heat generated by the electromagnetic field will deteriorate the structural integrity of the material from which the said members are fabricated. Accordingly, in those instances where the thickness of deposited material must be substantial and the tubular members are fabricated from low melting point polymeric resins, it will be necessary to provide a plurality of spacedly disposed microwave applicators past which the tubular members 18 successively move (with coolant stations located therebetween) so as to deposit the desired thickness of material.

Of course, it is also possible to increase or decrease the rate of deposition of thin film material onto the internal surface of the tubular members 18 through the adjustment of the power level at which the electromagnetic energy is transmitted to and introduced into the plasma region. As the power level of introduction of the electromagnetic energy is increased, the rate of decomposition of the precursor deposition gas, the rate of deposition of the thin film material and the temperature of the tubular members, all increase. Alternatively, as the power level of introduction of the electromagnetic energy is increased, the rate of decomposition of the precursor deposition gas, the rate of deposition of the thin film material and the thermal energy of the tubular members, all decrease. Accordingly, for temperature sensitive tubular members, it is necessary to utilize rapid movement of those members through the electromagnetic field and provide both a plurality of spacedly disposed deposition stations and a plurality of cooling stations located between the deposition stations.

Finally, referring to the FIG. 3 embodiment of the low temperature, plasma enhanced, chemical vapor deposition apparatus 10″ of the instant invention, like reference numerals will again refer to elements which function in substantially the same manner to achieve substantially the same result. In this embodiment of the apparatus 10″, microwave energy is once again transmitted from a source of electromagnetic energy (not shown), through a radiative microwave waveguide 14 (which is partially cut-away) so as to generate an electromagnetic field within a given volume of parameter space for the purpose of generating a plasma region 16′. Again, the radiative microwave waveguide 14 is operatively disposed on one side of the tubular member 16′, while a dummy load 20 is disposed on the opposite side of the outermost tubular member 18′ so as to capture any unused microwave energy before that energy can deleteriously effect the surrounding environment. A vacuum pump 24 is utilized to evacuate the annular space defined between the concentrically disposed outermost tubular member 18′ and the innermost tubular member 18″ so as to create said plasma region within the portion of the annular space exposed to the electromagnetic field.

As will be apparent to those of ordinary skill in the art, this FIG. 3 embodiment of the low temperature, plasma enhanced chemical vapor deposition apparatus 10″ of the instant invention differs from the previously described and illustrated embodiments because the actual deposition of thin film material occurs between the concentrically arranged tubular members (18′ and 18″) rather than interiorly of a single tubular member. More particularly, in the FIG. 3 embodiment, the deposition of thin film material will occur upon the external peripheral surface of the inner tubular member 18″ which is operatively disposed within the outer tubular member 18′. In order to accomplish this type of deposition, the outermost elongated tubular member 18′ has an interior diameter which is greater than the exterior diameter of the innermost tubular member 18″.

It now becomes essential that the outermost elongated tubular member 18′ be formed of microwave transmissive material, while the precursor deposition gas flows from the precursor gaseous source 22 through the annular space formed between the outermost and the innermost elongated tubular members so that the plasma is generated therebetween. As the precursor deposition gas flows through the annular space defined between the concentrically disposed elongated tubular members, that gas is decomposed by the electromagnetic field and deposited onto the external surface of said innermost elongated tubular member 18″. Obviously, the deposition of thin film material will also occur on the internal peripheral surface of the outermost elongated tubular member 18′. Therefore, depending on the thickness of the material being deposited and the length of the tubular member, it may be necessary to simultaneously move both of the concentric tubular members through the electromagnetic field. However, it is not necessary that both of the tubular members be moved therethrough at similar rates of speed. This is because the permissible thickness of material which can be deposited on the internal surface of the outermost tubular member is limited to a thickness that would not deleteriously affect the deposition of thin film material on the innermost tubular member 18″. The most apparent failure modes relate to (1) the deposition of a thickness of material which would flake from the wall of the outermost tubular member or (2) the deposition of a thickness of material thereupon which would cause crystallization and the concomitant loss of microwave transmissivity.

According to the principle advantage of the instant invention, it is necessary to provide a hermetic coating onto a surface of a tubular member by a plasma enhanced, chemical vapor deposition process. However that tubular member, which serves as a substrate, is thermally degradable at relatively low temperatures, for instance below 200° C.; and therefore the deposition must occur at those low temperatures. Of course, in alternate embodiments, the coating is not limited to hermetic seals and other types of coatings such as adherent, abrasion resistant coatings, chemically resistant coatings, thermally stable coatings, optically transmissive coatings, etc., may be applied as a result of the controlled low temperature plasma enhanced CVD process of the instant invention.

One type of hard, abrasion resistant, hermetic coating which falls within the scope of the instant invention is characterized by a unique infrared spectroscopy signature including (1) an Si—H bond stretch line at approximately 4.4 microns, (2) an Si—H$_2$ bond and/or a C—C stretch line at approximately 11.6 microns. Such a hermetic coating has been found to be substantially colorless and transparent in the visible portion of the electromagnetic spectrum and partially absorbing in the ultraviolet portion of that spectrum. That is, the light transmission is above about 87% as determined by ASTM D-1003. The light transmission at 550 nanometers is above about 89% when determined using a spectrophotometer.

The plasma enhanced chemical vapor deposition of the coating provides for a hard, chemical resistant, relatively thick, but substantially colorless coating to be applied to a thermally degradable substrate at controlled temperatures which are below the thermal degradation temperature of the substrate. More particularly, an especially adherent, glass hard coating can be deposited quickly at ambient temperatures without deformation, decomposition, outgassing or other degradation of the substrate or delamination of the coating. In some embodiments, it is preferred that the coating be thick enough to be abrasion and impact resistant, but thin enough to be light transmissive, i.e., on the order of about 0.1 to 10 microns thick. The deposition of the hard coating through a microwave process offers advantages of operation. In one embodiment, the composition of the precursor deposition gas to be introduced should be about 50 to 60 volume percent $N_2O$, 25 to 35 volume percent argon, 5 to 15 volume percent silane, and 5 to 15 volume percent alkyne, e.g., propylene. For a 3 cubic foot vacuum chamber, a gas flow rate of about 40 SCCM provides efficient gas utilization. The resonance time of exposure of the gases to the electromagnetic field would be about 0.0 to 0.10 seconds. The oxidate for formation of the coating be $O_2$, $CO_2$ and $N_2O$, water, or alcohol. Nitrogen can also be used as a carrier gas. The inert gas may be helium, neon, argon or krypton. Generally, for reasons of cost and energy transfer efficiency, the inert gas can be argon or helium, with argon being preferred. Hydrogen may also be incorporated into the gas stream.

It is to be noted that as used herein, the term "low temperature" chemical vapor deposition will refer to a process in which the substrate temperature is far below that temperature used in the modified chemical vapor deposition of low-loss single mode optical fibers typically consisting of a $P_2O_5$—$SiO_2$ cladding and a $GeO_2$—$P_2O_5$—$SiO_2$ core. Therefore, quantitatively, "low temperature" will refer to temperatures of substantially less than 2000° C., preferably less than 1650° C., desirably less than 1000° C., most preferably less than 300° C. and specifically less than the melting point of the synthetic plastic resin, i.e., less than 150° C.

As should be evident from the preceding description, there is disclosed herein a novel, low temperature, plasma enhanced chemical vapor deposition scheme in which thin film material may be deposited at sub-atmospheric pressures onto either the internal or the external wall of a tubular member. This may be accomplished without the necessity of actually introducing the microwave applicator into the interior of a vacuum chamber maintained at sub-atmospheric pressure of about less than 1 millitorr. Rather, the microwave applicator of the instant invention never sees vacuum conditions and may be maintained at atmospheric pressure, thereby eliminating the need for complicated and expensive vacuum sealing arrangements. The result is an economic, efficient deposition technique.

It should be understood that the present invention is not limited to the precise structure illustrated in the described embodiments. It is intended rather that the foregoing description be regarded as illustrative of said invention rather than limiting that invention. It is the following claims, including all equivalents, which define the true scope of the instant invention.

What is claimed is:

1. A method for the low temperature chemical vapor deposition of a film material onto a surface of at least one hollow member, said method including the non-sequential steps of:

providing a source of electromagnetic energy, said source including means for generating an electromagnetic field over a volume;

providing at least one first elongated tube having a surface to be coated, said first elongated tube having an external diameter;

providing a second elongated tube having an internal diameter greater than the external diameter of said at least one first elongated tube;

disposing said at least one first elongated tube internally of said second elongated tube;

positioning at least a portion of said surface to be coated within said electromagnetic field;

evacuating the portion of said surface over which the electromagnetic field is generated to sub-atmospheric pressure while maintaining said introducing means at ambient pressure;

flowing a precursor deposition gas about at least the portion of said surface exposed to said electromagnetic field;

maintaining said hollow member at a temperature lower than the melting point thereof; and activating said source of electromagnetic energy, whereby said deposition gas is deposited onto at least the portion of said surface of said at least one first elongated tube exposed to said electromagnetic field.

2. A method as in claim 1, wherein the source of electromagnetic energy is a microwave generator.

3. A method as in claim 2, wherein said at least one first elongated tube is formed of microwave transmissive material.

4. A method as in claim 3, wherein the precursor deposition gas flows through the interior of said at least one first elongated tube so as to generate a plasma therewithin.

5. A method as in claim 4, wherein the interior of said at least one first elongated tube is evacuated to sub-atmospheric pressure.

6. A method as in claim 5, wherein the precursor deposition gas introduced into the interior of said at least one first elongated tube comprises at least one element selected from the group consisting of silicon, oxygen, nitrogen, carbon, and combinations thereof.

7. A method as in claim 5, wherein the precursor deposition gas is adapted to deposit a hermetic coating onto the internal surface of said at least one first elongated tube.

8. A method as in claim 7, including the further step of moving the electromagnetic field and said at least one first elongated tube relative to one another, whereby the entire internal surface of said at least one first elongated tube is coated with thin film material.

9. A method as in claim 1, wherein said at least one first elongated tube is formed from a synthetic plastic resin.

10. A method as in claim 1, wherein the precursor deposition gas flows through the space formed between said at least one first elongated tube and said second elongated tube so as to generate a plasma therebetween.

11. A method as in claim 10, wherein said second elongated tube is formed of microwave transmissive material, whereby the precursor deposition gas flowing between said at least one first elongated tube and said second elongated tube is decomposed by the electromagnetic field and deposited onto at least a portion of the external surface of said at least one first elongated tube.

12. A method as in claim 11, wherein the precursor deposition gas comprises at least one element selected from the group consisting of silicon, oxygen, nitrogen, carbon, and mixtures or combinations thereof.

13. A method as in claim 12, wherein the precursor deposition gas is selected to deposit a hermetic coating onto the external surface of said at least one first elongated tube.

14. A method as in claim 11, including the further step of moving said at least one first elongated tube through said electromagnetic field.

15. A method as in claim 14, including the further step of maintaining said second elongated tube stationery as said at least one first elongated tube is moved through the electromagnetic field.

16. A method as in claim 14, including the further step of moving said second elongated tube through said electromagnetic field along with said at least one first elongated tube.

17. A method as in claim 16, including the further step of moving said at least one first elongated tube and said second elongated tube through said electromagnetic field at different rates of speed.

18. A method as in claim 14, including the further steps of providing a plurality of sources of electromagnetic energy, each source adapted to generate an electromagnetic field over spaced disposed volumes; and moving said at least one first elongated tube sequentially through said disposed volumes.

19. A method as in claim 18, including the further step of cooling the surface of said at least one first elongated tube after passing through at least one of said electromagnetic fields.

20. A method as in claim 1, including the further step of cutting said at least one first elongated tube into smaller length members after depositing the film material thereupon.

* * * * *